(12) United States Patent
Chang

(10) Patent No.: US 11,817,373 B2
(45) Date of Patent: Nov. 14, 2023

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventor: Jen-Yuan Chang, Hsinchu (TW)

(73) Assignee: TAIWAN SEMICONDUCTOR MANUFACTURING COMPANY LIMITED, Hsinchu (TW)

(*) Notice: Subject to any disclaimer, the term of this patent is extended or adjusted under 35 U.S.C. 154(b) by 212 days.

(21) Appl. No.: 17/361,452

(22) Filed: Jun. 29, 2021

(65) Prior Publication Data

US 2022/0310483 A1    Sep. 29, 2022

Related U.S. Application Data

(60) Provisional application No. 63/166,732, filed on Mar. 26, 2021.

(51) Int. Cl.
| | |
|---|---|
| *H01L 23/48* | (2006.01) |
| *H01L 21/768* | (2006.01) |
| *H01L 23/528* | (2006.01) |
| *H01L 23/522* | (2006.01) |

(52) U.S. Cl.
CPC ...... *H01L 23/481* (2013.01); *H01L 21/76898* (2013.01)

(58) Field of Classification Search
CPC ............. H01L 23/481; H01L 21/76898; H01L 23/5286; H01L 21/76897; H01L 23/5226
See application file for complete search history.

(56) References Cited

U.S. PATENT DOCUMENTS

| | | | |
|---|---|---|---|
| 2005/0110159 A1* | 5/2005 | Oh ......................... | H01L 25/50 257/777 |
| 2009/0269905 A1* | 10/2009 | Chen ................. | H01L 21/76898 257/E21.546 |
| 2015/0243611 A1* | 8/2015 | Liu ......................... | H01L 24/80 438/653 |
| 2017/0033006 A1* | 2/2017 | Siew ................. | H01L 21/76811 |

* cited by examiner

*Primary Examiner* — Herve-Louis Y Assouman
(74) *Attorney, Agent, or Firm* — COOPER LEGAL GROUP, LLC

(57) ABSTRACT

A semiconductor arrangement and method of forming the semiconductor arrangement are provided. The semiconductor arrangement includes a device having a first surface and a second surface opposite the first surface. A first through substrate via (TSV) structure extends between the first surface and the second surface in a first region of the device. A second TSV structure extends between the first surface and the second surface in a second region of the device. The first TSV structure has a first cross-sectional area. The second TSV structure has a second cross-sectional area greater than the first cross-sectional area.

20 Claims, 8 Drawing Sheets

SEMICONDUCTOR ARRANGEMENT AND METHOD OF MAKING

RELATED APPLICATIONS

This application claims priority to U.S. Provisional Patent Application 63/166,732, filed on Mar. 26, 2021, which is incorporated herein by reference.

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

DESCRIPTION OF THE DRAWINGS

Aspects of the disclosure are understood from the following detailed description when read with the accompanying drawings. It will be appreciated that elements and/or structures of the drawings are not necessarily drawn to scale. Accordingly, the dimensions of the various features may be arbitrarily increased and/or reduced for clarity of discussion.

DETAILED DESCRIPTION

Figure 1:
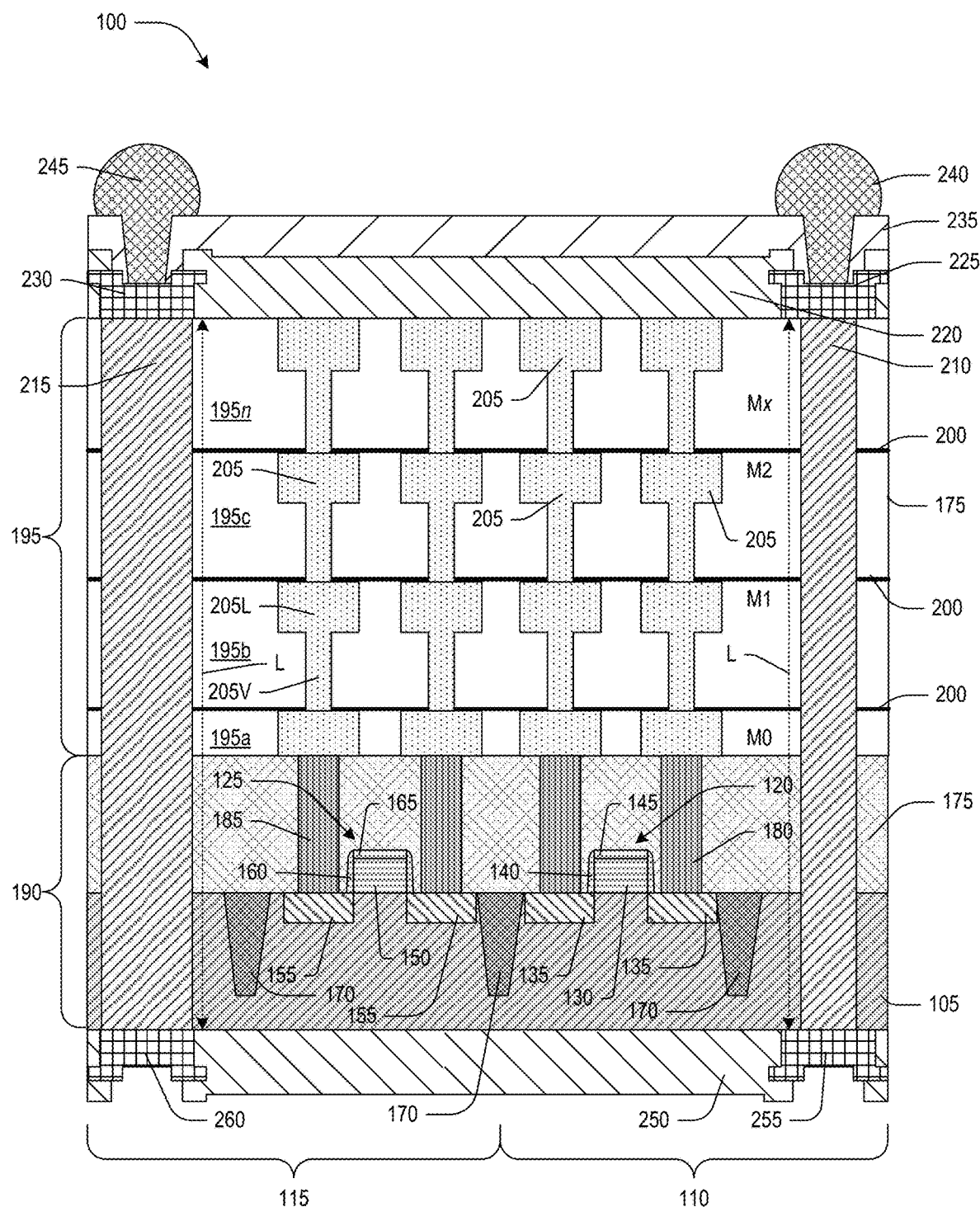
FIG. 1 is a cross-section view of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. To allow vertical stacking of devices to increase density, some devices include through silicon via (TSV) structures that extend from a top surface of the device to a bottom surface of the device to allow signals to be passed vertically to another device below and/or above the subject device. According to some embodiments, a first TSV structure formed in a first region of a device has a first cross-sectional area less than a first cross-sectional area of a second TSV structure formed in a second region of the device. The first cross-sectional area and the second cross-sectional area are taken in the same plane.

For many applications, a low voltage power domain has more cells and occupies a larger portion of a design as compared to a high voltage power domain that has relatively fewer cells and occupies a relatively smaller portion of the design. For example, a low voltage domain may include a core region of the device or a memory region of the device, and a high voltage domain may include an input/output region of the device or a power supply region of the device. Power losses in interconnect structures, such as TSV structures, are dependent on the voltage of the signal and the resistance of the TSV structure. Providing a TSV structure with a larger cross-sectional area in a high voltage domain decreases power loss.

FIG. 1 is a cross-section view illustrating a portion of a semiconductor arrangement 100 according to some embodiments. In some embodiments, the semiconductor arrangement 100 is formed on a substrate layer 105 comprising at least one of an epitaxial layer, a single crystalline semiconductor material, such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, a wafer, or a die formed from a wafer. In some embodiments, the substrate layer 105 comprises at least one of crystalline silicon or other suitable materials. Other structures and/or configurations of the substrate layer 105 are within the scope of the present disclosure.

According to some embodiments, the semiconductor arrangement 100 comprises a first region 110 and a second region 115. In some embodiments, the first region 110 is a core region, a memory region, and/or a logic region with a semiconductor device 120 in a first voltage domain operating according to a first supply voltage. In some embodiments, the second region 115 is an input/output region or a power supply region with a semiconductor device 125 in a second voltage domain operating according to a second supply voltage. For example, the first supply voltage in the first region 110 may be less than the second supply voltage in the second region 115.

In some embodiments, the first region 110 is formed on or within the substrate layer 105. In some embodiments, the first region 110 comprises the semiconductor device 120 formed on or within the substrate layer 105. In some embodiments, the semiconductor device 120, which may be a transistor, comprises a gate structure 130, source/drain regions 135, a sidewall spacer 140, a gate cap layer 145, etc. According to some embodiments, the gate structure 130 is formed by forming a sacrificial gate structure comprising a sacrificial gate dielectric layer, a sacrificial polysilicon layer, and a hard mask layer. In some embodiments, a patterning process is performed to pattern the hard mask layer corresponding to the pattern of gate structures to be formed, and an etch process is performed using the patterned hard mask layer to etch the sacrificial polysilicon layer and the sacrificial gate dielectric layer to define the sacrificial gate structure. In some embodiments, remaining portions of the hard mask layer form a cap layer over the portions of the sacrificial polysilicon layer remaining after the etch process. In some embodiments, the sacrificial gate structure is later replaced with a replacement gate dielectric layer and a replacement gate electrode (not separately shown).

In some embodiments, a gate dielectric layer of the gate structure 130, such as the replacement gate dielectric layer, comprises a high-k dielectric material. As used herein, the term "high-k dielectric" refers to the material having a dielectric constant, k, greater than or equal to about 3.9, which is the k value (dielectric constant) of $SiO_2$. The material of the high-k dielectric layer may comprise any suitable materials. Examples of the material of the high-k dielectric layer include, but are not limited to, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, an alloy thereof, and/or other suitable materials. Each value of x is independently from 0.5 to 3, and each value of y is independently from 0 to 2. In some embodiments, the gate dielectric layer comprises a native oxide layer formed by exposure of the semiconductor arrangement 100 to oxygen at various points in the process flow, causing the formation of silicon dioxide on exposed surfaces. In some embodiments, an additional layer of dielectric material, such as comprising silicon dioxide, a high-k dielectric material, and/or other suitable materials, is formed over the native oxide to form the gate dielectric layer.

In some embodiments, a gate electrode of the gate structure 130, such as the replacement gate electrode, comprises a barrier layer, one or more work function material layers, a seed layer, a metal fill layer, and/or other suitable layers. In some embodiments, the metal fill layer comprises tungsten, aluminum, copper, cobalt, and/or other suitable materials. In some embodiments, the gate dielectric layer and/or the one or more layers that comprise the gate electrode are formed by at least one of atomic layer deposition (ALD), physical vapor deposition (PVD), chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), or other suitable techniques. In some embodiments, the gate electrode is recessed to define a recess, and the gate cap layer 145 is formed in the recess.

In some embodiments, the sidewall spacer 140 is formed adjacent the gate structure 130. In some embodiments, the sidewall spacer 140 is formed by depositing a spacer layer over the gate structure 130 and performing an anisotropic etch process to remove horizontal portions of the spacer layer, such as to expose at least some of the substrate layer 105. In some embodiments, the sidewall spacer 140 comprises silicon nitride and/or other suitable materials.

In some embodiments, the source/drain regions 135 are formed in the substrate layer 105 after forming the gate structure 130. For example, in some embodiments, portions of the substrate layer 105 are doped through an implantation process to form the source/drain regions 135. In some embodiments, an etch process is performed to recess the substrate layer 105 adjacent the sidewall spacer 140, and an epitaxial growth process is performed to form the source/drain regions 135. Other structures and/or configurations of the semiconductor device 120 are within the scope of the present disclosure.

In an embodiment, the second region 115 is formed on or within the substrate layer 105. In some embodiments, the second region 115 comprises the semiconductor device 125 formed on or within the substrate layer 105. In some embodiments, the semiconductor device 125, which may be a transistor, comprises a gate structure 150, source/drain regions 155, a sidewall spacer 160, a gate cap layer 165, etc. In some embodiments, one or more processes described for forming the semiconductor device 120 may be used to form the semiconductor device 125. In some embodiments, one or more materials described for forming the semiconductor device 120 may be used to form the semiconductor device 125. In some embodiments, at least some different materials are used due to the different voltage domain. For example, the gate dielectric material may be different and/or may have a different thickness in the semiconductor device 125 compared to the semiconductor device 120. In some embodiments, the materials of the gate electrode may also differ in the semiconductor device 125 compared to the semiconductor device 120. Other structures and/or configurations of the semiconductor device 125 are within the scope of the present disclosure.

In some embodiments, one or more shallow trench isolation (STI) structures 170 are formed within the substrate layer 105. In some embodiments, the STI structures 170 are formed by forming at least one mask layer over the substrate layer 105. In some embodiments, the mask layer comprises a layer of oxide material over the substrate layer 105, a layer of nitride material over the layer of oxide material, and/or one or more other suitable layers. At least some of the layer of mask layer is removed to define an etch mask for use as a template to etch the substrate layer 105 to form trenches. A dielectric material is formed in the trenches to define the STI structures 170. In some embodiments, the STI structures 170 include multiple layers, such as an oxide liner, a nitride liner formed over the oxide liner, an oxide fill material formed over the nitride liner, and/or other suitable materials.

In some embodiments, a fill material of the STI structures 170 is formed using a high density plasma (HDP) process. The HDP process uses precursor gases comprising at least one of silane ($SiH_4$), oxygen, argon, or other suitable gases. The HDP process includes a deposition component, which forms material on surfaces defining the trenches, and a sputtering component, which removes or relocates deposited material. A deposition-to-sputtering ratio depends on gas ratios employed during the deposition. According to some embodiments, argon and oxygen act as sputtering sources, and the particular values of the gas ratios are determined based on aspect ratios of the trenches. After forming the fill material, an anneal process is performed to densify the fill material. In some embodiments, the STI structures 170 generate compressive stress that serves to compress the first region 110 and/or the second region 115

Although the substrate layer 105 and the STI structures 170 are illustrated as having coplanar upper surfaces at an interface where the substrate layer 105 abuts the STI structures 170, the relative heights can vary. For example, the STI structures 170 can be recessed relative to the substrate layer 105, or the substrate layer 105 can be recessed relative to the STI structures 170. The relative heights at the interface depend on the processes performed for forming the STI structures 170, such as at least one of deposition, planarization, mask removal, surface treatment, or other suitable techniques. In some embodiments, the STI structures 170 are formed prior to forming the semiconductor devices 120, 125. Other structures and/or configurations of the STI structures 170 are within the scope of the present disclosure.

In some embodiments, a dielectric layer 175 is formed over the semiconductor devices 120, 125. In some embodiments, the dielectric layer 175 is formed prior to replacing the gate structures. In some embodiments, the dielectric layer 175 comprises silicon dioxide, a low-k material, and/or other suitable materials. A low-k layer is, in some embodiments, further characterized or classified as ultra low-K (ULK), extra low-K (ELK), or extreme low-k (XLK), where the classification is generally based upon the k value. For example, ULK generally refers to materials with a k value of between about 2.7 to about 2.4, ELK generally refers to materials with a k value of between about 2.3 to about 2.0, and XLK generally refers to materials with a k value of less than about 2.0. In some embodiments, the dielectric layer 175 comprises one or more layers of low-k dielectric material. Low-k dielectric materials have a k value lower than about 3.9. In some embodiments, the materials for the dielectric layer 175 comprise at least one of Si, O, C, or H, such as SiCOH, SiOC, oxygen-doped SiC (ODC), nitrogen-doped SiC (NDC), plasma-enhanced oxide (PEOX), and/or other suitable materials. Organic material, such as polymers, may be used for the dielectric layer 175. In some embodiments, the dielectric layer 175 comprises one or more layers of a carbon-containing material, organo-silicate glass, a porogen-containing material, and/or other suitable materials. The dielectric layer 175 comprises nitrogen in some embodiments. In some embodiments, the dielectric layer 175 is formed by using, for example, at least one of CVD, plasma-enhanced chemical vapor deposition (PECVD), LPCVD, ALCVD, a spin-on technology, or other suitable techniques. In some embodiments, the dielectric layer 175 comprises one or more layers, at least some of which may have a same material composition. In some embodiments, there are one or more layers of the dielectric layer 175, at least some of which may have a same material composition. Other structures and/or configurations of the dielectric layer 175 are within the scope of the present disclosure.

In some embodiments, the first region 110 comprises one or more conductive contacts 180 formed in the dielectric layer 175 and electrically connected to the semiconductor device 120 within the first region 110. In some embodiments, the second region 115 comprises one or more conductive contacts 185 formed in the dielectric layer 175 and electrically connected to the semiconductor device 125 within the second region 115. The conductive contacts 180, 185 are formed in any number of ways, such as by a single damascene process, a dual damascene process, a trench silicide process, and/or other suitable techniques. In some embodiments, additional contacts (not shown) are formed to contact the semiconductor device 120 and/or the semiconductor device 125 in different positions, such as into or out of the page. In some embodiments, the conductive contacts 180, 185 comprise a barrier layer, a seed layer, a metal fill layer, and/or other suitable layers. In some embodiments, the metal fill layer comprises tungsten, aluminum, copper, cobalt, and/or other suitable materials. Other structures and/or configurations of the conductive contacts 180, 185 are within the scope of the present disclosure. In some embodiments, at least one of the semiconductor devices 120, 125, the conductive contacts 180, 185, the dielectric layer 175, the substrate layer 105, or the STI structures 170 define a device layer 190 of the semiconductor arrangement 100.

In some embodiments, the semiconductor arrangement 100 comprises one or more dielectric layers 195 formed over the device layer 190. According to some embodiments, the one or more dielectric layers 195 comprise a second dielectric layer 195a, a third dielectric layer 195b, a fourth dielectric layer 195c, and an n-th dielectric layer 195n. Any number of dielectric layers are contemplated. In some embodiments, at least one of the dielectric layers 195 comprises a material with a dielectric constant of 3.9 or above, such as $SiO_2$. In some embodiments, at least one of the dielectric layers 195 comprises a dielectric material with a relatively low dielectric constant, as described for the dielectric layer 175. The dielectric layers 195 are formed in any number of ways, such as by thermal growth, chemical growth, ALD, CVD, PECVD, and/or other suitable techniques. In some embodiments, one or more of the dielectric layers 195 in a lower portion comprise ULK or ELK dielectric materials, one or more of the dielectric layers 195 in an intermediate portion comprise low-k dielectric materials, and one or more of the dielectric layers 195 in an upper portion comprise dielectric materials, such as doped or undoped silicon glass.

In some embodiments, the semiconductor arrangement 100 comprises one or more etch stop layers 200 separating the dielectric layers 195. In some embodiments, the etch stop layers 200 stop an etching process between the dielectric layers 195. According to some embodiments, the etch stop layers 200 comprise a dielectric material having a different etch selectivity from the dielectric layers 195. In some embodiments, at least one of the etch stop layers 200 comprises SiN, SiCN, SiCO, and/or CN. The etch stop layers 200 are formed in any number of ways, such as by thermal growth, chemical growth, ALD, CVD, PECVD, and/or other suitable techniques.

In some embodiments, the semiconductor arrangement 100 comprises one or more conductive contacts 205 electrically connected to the conductive contacts 180, 185. In some embodiments, the conductive contacts 205 extend through respective dielectric layers 195. In some embodiments, at least one of the conductive contacts 205 comprise a via portion 205V and a line portion 205L. The line portions 205L are wider than the via portions 205V, and the line portions 205L have an axial length extending into the page. In some embodiments, the conductive contacts 205 comprise a barrier layer, a seed layer, a metal fill layer, and/or other suitable layers. In some embodiments, the metal fill layer comprises tungsten, aluminum, copper, cobalt, and/or other suitable materials. Other structures and/or configurations of the conductive contacts 205 are within the scope of the present disclosure. In some embodiments, a combination of a particular dielectric layer 195 and one or more conductive contacts 205 in the particular dielectric layer 195 define a metallization layer of the semiconductor arrangement 100, such as layers "M0," "M1," "M2", and "Mx."

In some embodiments, a first TSV structure 210 is formed in the first region 110 and a second TSV structure 215 is formed in the second region 115. In some embodiments, the TSV structures 210, 215 extend through the substrate layer 105 and the dielectric layers 175, 195a-195n. In some embodiments, the TSV structures 210, 215 comprise a barrier layer, a seed layer, a metal fill layer, and/or other suitable layers. In some embodiments, the metal fill layer comprises tungsten, aluminum, copper, cobalt, and/or other suitable materials. In some embodiments, additional TSV structures are provided in the first region 110 and/or the second region 115. Other structures and/or configurations of the TSV structures 210, 215 are within the scope of the present disclosure.

In some embodiments, at least one passivation layer 220 is formed over the dielectric layer 195n. In some embodiments, the passivation layer 220 comprises silicon oxide/silicon nitride ($SiO_2/Si_3N_4$), titanium nitride, doped silicon dioxide, polyimide, and/or other suitable materials. In some embodiments, the passivation layer 220 is formed by ALD, CVD, PECVD, and/or other suitable techniques. Other structures and/or configurations of the passivation layer 220 are within the scope of the present disclosure.

In some embodiments, conductive contact pads 225, 230 are formed in the passivation layer 220. In some embodiments, the passivation layer 220 includes multiple layers, where the conductive contact pads 225, 230 are formed in a first layer of the passivation layer 220 and an additional layer of passivation material is formed over the conductive contact pads 225, 230 and patterned to expose upper surfaces of the conductive contact pads 225, 230. In some embodiments, the conductive contact pads 225, 230 are electrically connected to the TSV structures 210, 215 and comprise aluminum and/or other suitable materials. Other structures and/or configurations of the conductive contact pads 225, 230 are within the scope of the present disclosure.

In some embodiments, a polyimide layer 235 is formed over the passivation layer 220 and patterned to expose the conductive contact pads 225, 230. In some embodiments, the polyimide layer 235 is a photosensitive polyimide layer that is patterned with photolithography and can, after patterning and etching, remain on the surface of the passivation layer 220 on which the polyimide layer 235 has been deposited to serve as a second passivation layer. In some embodiments, a precursor of the polyimide layer 235 is first deposited by spin coating and/or other suitable techniques. The precursor is, after a low temperature pre-bake, exposed to electromagnetic radiation using a light source and a reticle. Portions of the precursor that are exposed are cross-linked thereby leaving unexposed portions (that are not cross-linked) over the conductive contact pads 225, 230. During subsequent development, the unexposed portions over the conductive contact pads 225, 230 are dissolved, thereby providing openings over the conductive contact pads 225, 230. In some embodiments, a thermal curing process is performed on the polyimide layer 235. Other structures and/or configurations of the polyimide layer 235 are within the scope of the present disclosure.

In some embodiments, solder bumps 240, 245 are formed over the polyimide layer 235 and are electrically connected to the conductive contact pads 225, 230. In some embodiments, an under-bump metal layer (not shown), such as comprising nickel and/or other suitable materials, is formed over the conductive contact pads 225, 230 prior to forming the solder bumps 240, 245. In some embodiments, the solder bumps 240, 245 are formed by applying a flux and/or paste to a solder material and performing a thermal reflowing process. Other structures and/or configurations of the solder bumps 240, 245 are within the scope of the present disclosure. In some embodiments, the solder bumps 240, 245 are omitted and external contact to the TSV structures 210, 215 is facilitated by the conductive contact pads 225, 230.

In some embodiments, at least one passivation layer 250 is formed over (or under) the substrate layer 105. For example, in some embodiments, the semiconductor arrangement 100 is flipped during processing such a bottom surface of the substrate layer 105 as shown in FIG. 1 faces upward, and the passivation layer 250 is formed on the bottom surface of the substrate layer 105 (thereby forming the passivation layer 250 over the substrate layer 105 while the semiconductor arrangement is flipped). In some embodiments, the passivation layer 250 comprises silicon oxide/silicon nitride ($SiO_2/Si_3N_4$), titanium nitride, doped silicon dioxide, polyimide, and/or other suitable materials. In some embodiments, the passivation layer 250 is formed by ALD, CVD, PECVD, and/or other suitable techniques. Other structures and/or configurations of the passivation layer 250 are within the scope of the present disclosure.

In some embodiments, conductive contact pads 255, 260 are formed in the passivation layer 250. In some embodiments, the passivation layer 250 includes multiple layers, where the conductive contact pads 255, 260 are formed in a first layer of the passivation layer 250 and an additional layer of passivation material is formed over the conductive contact pads 255, 260 and patterned to expose upper surfaces of the conductive contact pads 255, 260. In some embodiments, the conductive contact pads 255, 260 are electrically connected to the TSV structures 210, 215 and comprise aluminum and/or other suitable materials. Other structures and/or configurations of the conductive contact pads 255, 260 are within the scope of the present disclosure.

In some embodiments, the conductive contact pads 225, 230 and/or the solder bumps 240, 245 facilitate front-side connections to the semiconductor arrangement 100, and the conductive contact pads 255, 260 facilitate back-side connections to the semiconductor arrangement 100. In some embodiments, one or more of the conductive contacts 205 are conductively coupled to the TSV structures 210, 215, thereby supplying power to the semiconductor device 120 and/or the semiconductor device 125.

Figure 2:
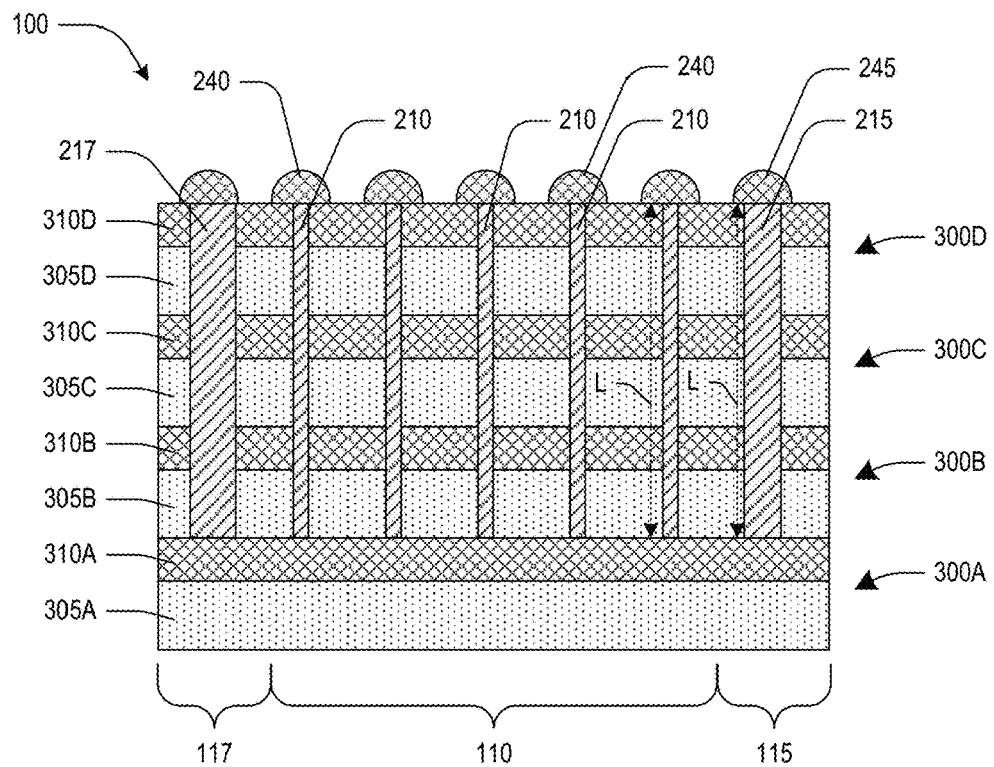
FIG. 2 is a cross-section view of a semiconductor arrangement, in accordance with some embodiments.
Figure 3:
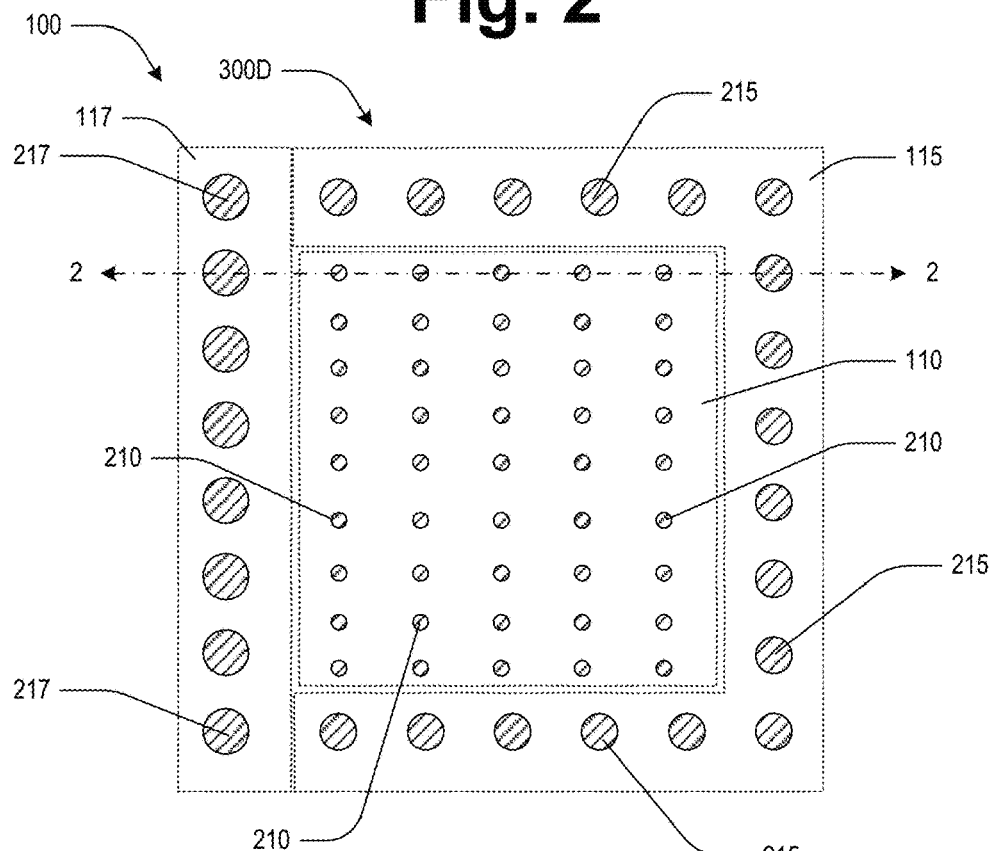
FIGS. 3-7 and 7A are top views of a semiconductor arrangement, in accordance with some embodiments.

Referring to FIGS. 2 and 3, a cross-section view and a top view of a semiconductor arrangement 100 comprising stacked devices 300A, 300B, 300C, 300D are provided, in accordance with some embodiments. The cross-section view in FIG. 2 is taken along line 2-2 shown in FIG. 3. The uppermost device 300D is visible in FIG. 3. The devices 300A, 300B, 300C, 300D each comprise a device layer 305A, 305B, 305C, 305D and a metallization layer 310A, 310B, 310C, 310D. The metallization layers 310A, 310B, 310C, 310D may include multiple layers, such as the metallization layers M0-Mx shown in FIG. 1. In some embodiments, the metallization layers 310A, 310B, 310C, 310D each comprise the passivation layers 220, 250, the polyimide layer 235, and the conductive contact pads 225, 230, 255, 260. At least some of the devices 300A, 300B, 300C, 300D comprise the first region 110 including the TSV structure 210, the second region 115 including the TSV structure 215, and a third region 117 including a TSV structure 217. In some embodiments, the TSV structures 210 in the devices 300A, 300B, 300C, 300D conductively contact the TSV structures 210 in the vertically adjacent devices 300A, 300B, 300C, 300D (e.g., the TSV structure 210 in the device 300A conductively contacts the TSV structure 210 in the device 300B, the TSV structure 210 in the device 300B conductively contacts the TSV structures 210 in the devices 300A, 300C, etc.), the TSV structures 215 in the devices 300A, 300B, 300C, 300D conductively contact the TSV structures 215 in the vertically adjacent devices 300A, 300B, 300C, 300D, and the TSV structures 217 in the devices 300A, 300B, 300C, 300D conductively contact the TSV structures 217 in the vertically adjacent devices 300A, 300B, 300C, 300D. In some embodiments, the TSV structures 210, 215, 217 do not extend through the lowermost device 300A, but rather, the TSV structures 210, 215, 217 conductively contact conductive contact pads on the uppermost surface of the device 300A.

In some embodiments, the first region 110 comprises a core region, the second region 115 comprises an input/output (I/O) region, and the third region 117 comprises a power distribution region. In some embodiments, the first region 110 and the second region 115 operate using different supply voltages. In some embodiments, a first supply voltage of the first region 110 is less than a second supply voltage of the second region 115. In some embodiments, the third region 117 is a power plane for providing power for the devices 300A, 300B, 300C, 300D at the second supply voltage, which is stepped down to the first supply voltage to supply power to the first region 110. With reference to FIG. 3, in some embodiments, the TSV structure 210 has a first cross-sectional area (measured in a plane perpendicular to a top surface of the substrate layer 105), the TSV structure 215 has a second cross-sectional area greater than the first cross-sectional area, and the TSV structure 217 has a third cross-sectional area greater than the second cross-sectional area. The first cross-sectional area, the second cross-sectional area, and the third cross-sectional area are compared in the same plane, since the TSV structures 210, 215, 217 may taper along their lengths, L, (extending in a direction perpendicular to the top surface of the substrate layer). The increased cross-sectional areas of the TSV structures 215, 217 result in reduced resistive power losses. In some embodiments, the first region 110 has an increased density of TSV structures 210 compared to the density of the TSV structures 215, 217 in the regions 115, 117, tending to increase performance in the first region 110.

Figure 4:
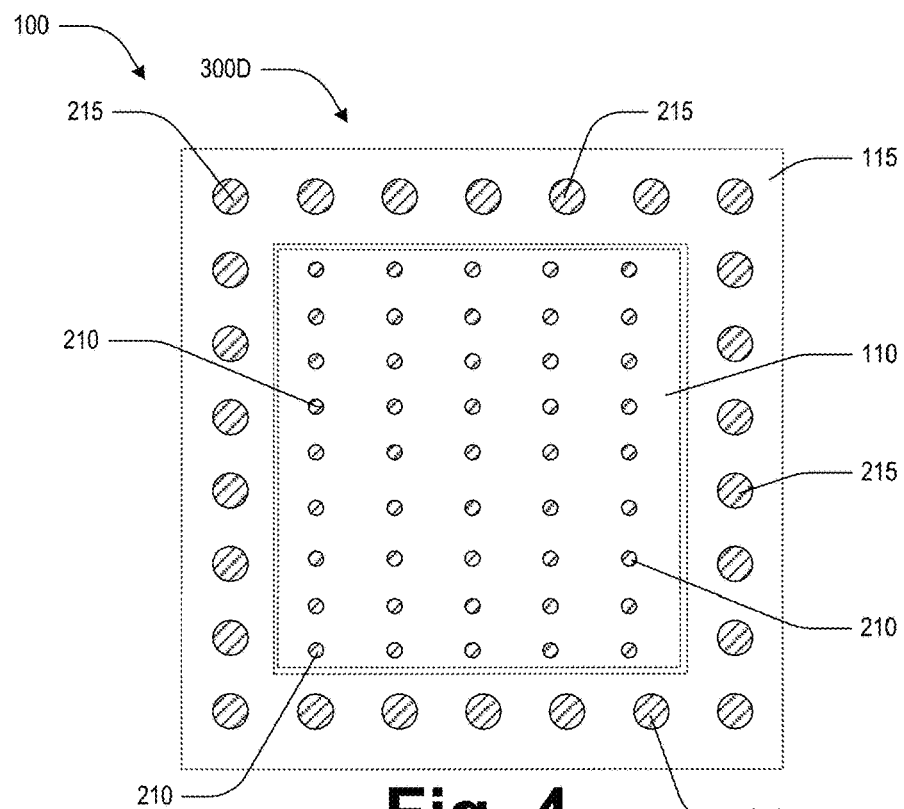

Referring to FIG. 4, a top view of the semiconductor arrangement 100 is provided, in accordance with some embodiments. The uppermost device 300D is visible in FIG. 4. The devices 300A, 300B, 300C, 300D each comprise a device layer 305A, 305B, 305C, 305D and a metallization layer 310A, 310B, 310C, 310D. The metallization layers 310A, 310B, 310C, 310D may include multiple layers, such as the metallization layers M0-Mx shown in FIG. 1. In some embodiments, the metallization layers 310A, 310B, 310C, 310D each comprise the passivation layers 220, 250, the polyimide layer 235, and the conductive contact pads 225, 230, 255, 260. At least some of the devices 300A, 300B, 300C, 300D comprise the first region 110 including the TSV structure 210 and the second region 115 including the TSV structure 215. In some embodiments, the TSV structures 210, 215 do not extend through the lowermost device 300A, but rather, the TSV structures 210, 215 conductively contact conductive contact pads on the uppermost surface of the device 300A.

In some embodiments, the first region 110 comprises a core region and the second region 115 comprises an I/O region. In some embodiments, power plane connections may be provided in the second region 115. In some embodiments, the first region 110 and the second region 115 operate using different supply voltages. In some embodiments, a first supply voltage of the first region 110 is less than a second supply voltage of the second region 115. In some embodiments, the TSV structure 210 has a first cross-sectional area and the TSV structure 215 has a second cross-sectional area greater than the first cross-sectional area. The first cross-sectional area and the second cross-sectional area are compared in the same plane, since the TSV structures 210, 215 may taper along their lengths. The increased cross-sectional area of the TSV structure 215 results in reduced resistive power losses. In some embodiments, the first region 110 has an increased density of TSV structures 210 compared to the density of the TSV structures 215 in the second region 115, tending to increase performance in the first region 110.

Figure 5:
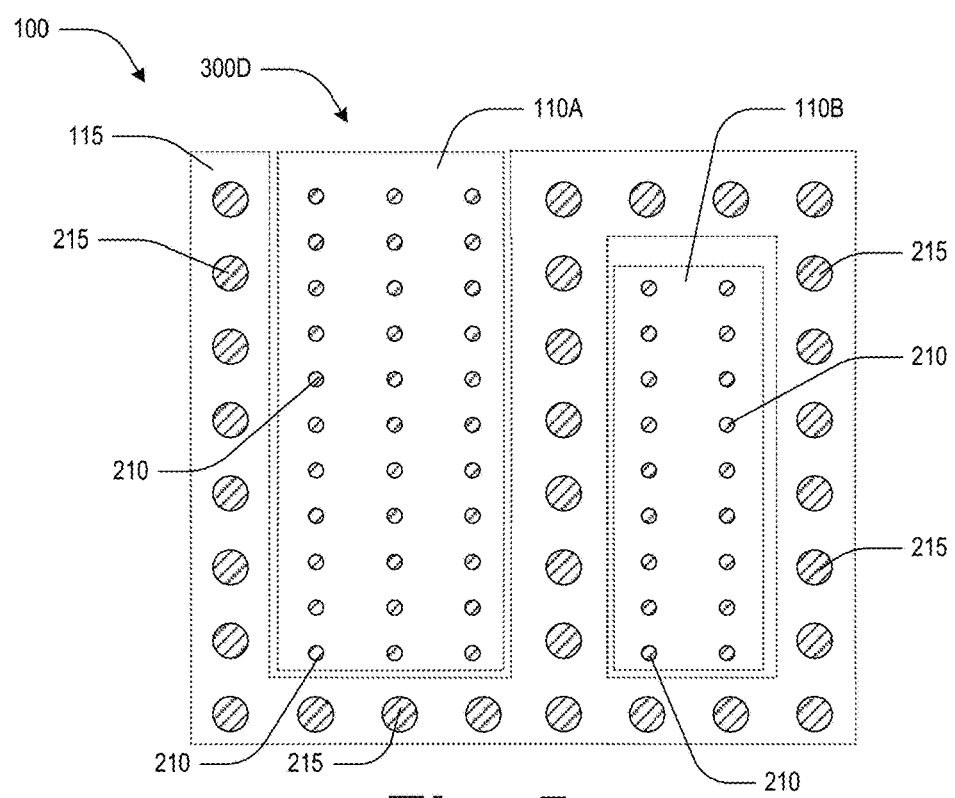

Referring to FIG. 5, a top view of the semiconductor arrangement 100 is provided, in accordance with some embodiments. The uppermost device 300D is visible in FIG. 5. The devices 300A, 300B, 300C, 300D each comprise a device layer 305A, 305B, 305C, 305D and a metallization layer 310A, 310B, 310C, 310D. The metallization layers 310A, 310B, 310C, 310D may include multiple layers, such as the metallization layers M0-Mx shown in FIG. 1. In some embodiments, the metallization layers 310A, 310B, 310C, 310D each comprise the passivation layer 220, 250, the polyimide layer 235, and the conductive contact pads 225, 230, 255, 260. At least some of the devices 300A, 300B, 300C, 300D comprise first regions 110A, 110B including the TSV structure 210 and the second region 115 including the TSV structure 215. In some embodiments, the TSV structures 210, 215 do not extend through the lowermost device 300A, but rather, the TSV structures 210, 215 conductively contact conductive contact pads on the uppermost surface of the device 300A.

In some embodiments, the first regions 110A, 110B comprises core regions and the second region 115 comprises an I/O region. In some embodiments, power plane connections may be provided in the second region 115. In some embodiments, the first regions 110A, 110B and the second region 115 operate using different supply voltages. In some embodiments, a first supply voltage of the first regions 110A, 110B is less than a second supply voltage of the second region 115. In some embodiments, the TSV structure 210 has a first cross-sectional area and the TSV structure 215 has a second cross-sectional area greater than the first cross-sectional area. The first cross-sectional area and the second cross-sectional area are compared in the same plane, since the TSV structures 210, 215 may taper along their lengths. The increased cross-sectional area of the TSV structure 215 results in reduced resistive power losses. In some embodiments, the first regions 110A, 110B have an increased density of TSV structures 210 compared to the density of the TSV structures 215 in the second region 115, tending to increase performance in the first regions 110A, 110B.

Figure 6:
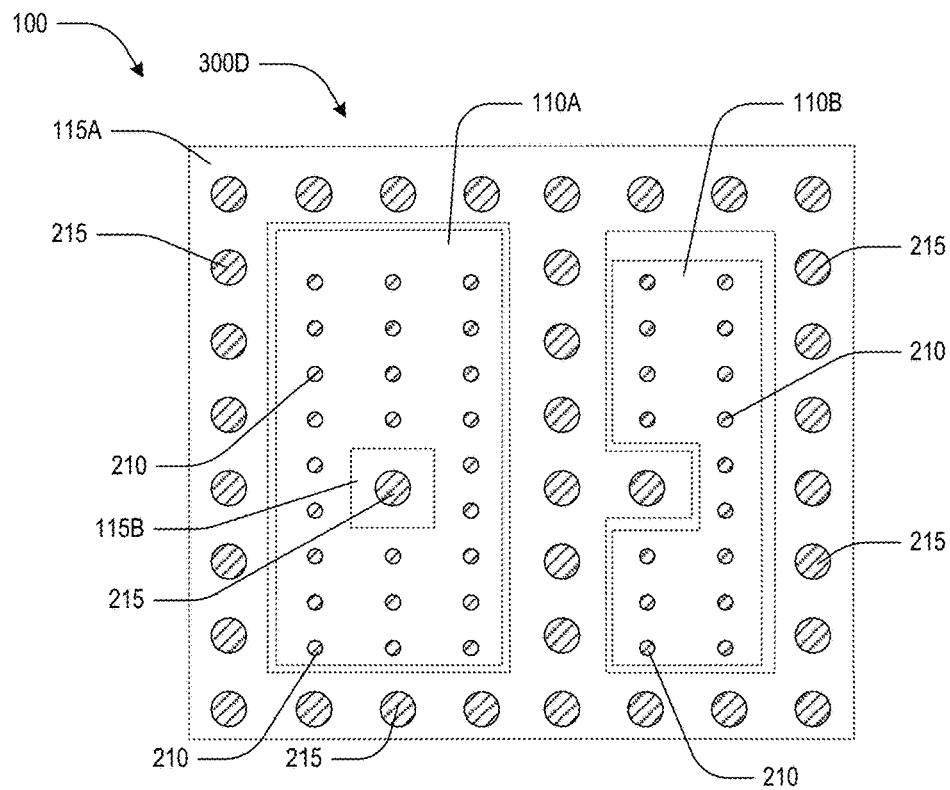

Referring to FIG. 6, a top view of the semiconductor arrangement 100 is provided, in accordance with some embodiments. The uppermost device 300D is visible in FIG. 6. The devices 300A, 300B, 300C, 300D each comprise a device layer 305A, 305B, 305C, 305D and a metallization layer 310A, 310B, 310C, 310D. The metallization layers 310A, 310B, 310C, 310D may include multiple layers, such as the metallization layers M0-Mx shown in FIG. 1. In some embodiments, the metallization layers 310A, 310B, 310C, 310D each comprise the passivation layers 220, 250, the polyimide layer 235, and the conductive contact pads 225, 230, 255, 260. At least some of the devices 300A, 300B, 300C, 300D comprise first regions 110A, 110B including the TSV structure 210 and second regions 115A, 115B including the TSV structure 215. In some embodiments, the TSV structures 210, 215 do not extend through the lowermost device 300A, but rather, the TSV structures 210, 215 conductively contact conductive contact pads on the uppermost surface of the device 300A.

In some embodiments, the first regions 110A, 110B comprises core regions and the second regions 115A, 115B comprise I/O regions. In some embodiments, power plane connections may be provided in one or both of the second regions 115A, 115B. In some embodiments, the first regions 110A, 110B and the second regions 115A, 115B operate using different supply voltages. In some embodiments, a first supply voltage of the first regions 110A, 110B is less than a second supply voltage of the second regions 115A, 115B. In some embodiments, the TSV structure 210 has a first cross-sectional area and the TSV structure 215 has a second cross-sectional area greater than the first cross-sectional area. The first cross-sectional area and the second cross-sectional area are compared in the same plane, since the TSV structures 210, 215 may taper along their lengths. The increased cross-sectional area of the TSV structure 215 results in reduced resistive power losses. In some embodiments, the first regions 110A, 110B have an increased density of TSV structures 210 compared to the density of the TSV structures 215 in the second regions 115A, 115B, tending to increase performance in the first regions 110A, 110B.

Figure 7:
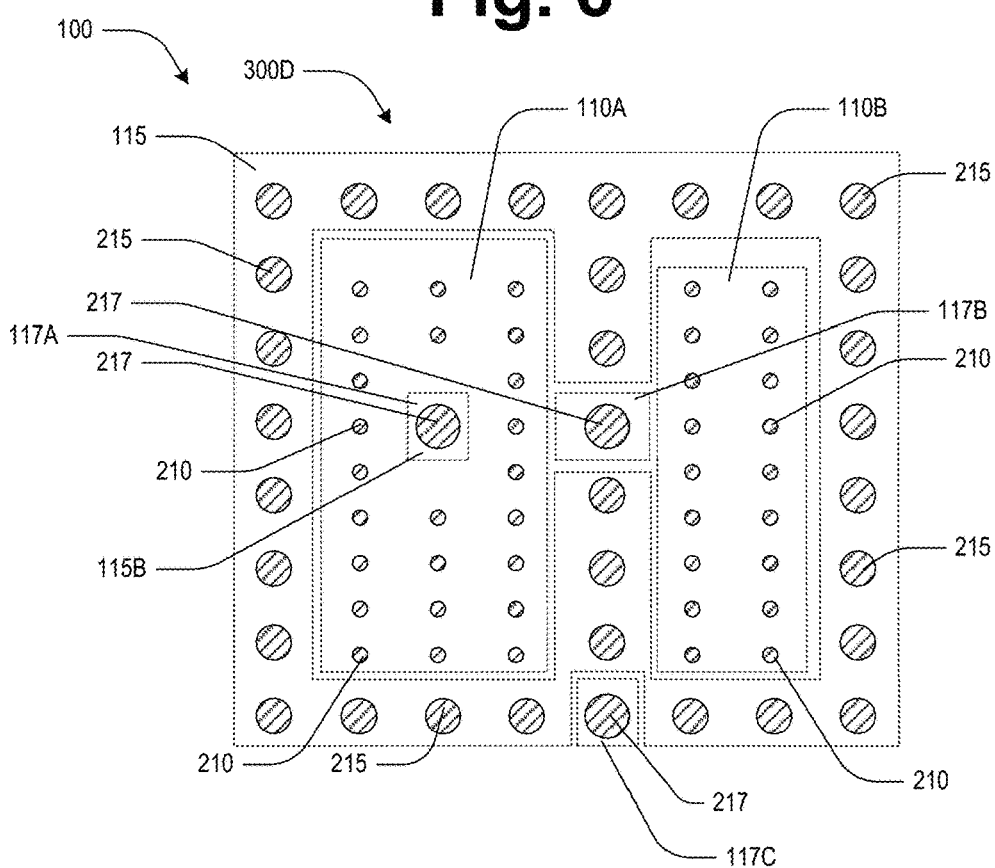

Referring to FIG. 7, a top view of the semiconductor arrangement 100 is provided, in accordance with some embodiments. The uppermost device 300D is visible in FIG. 7. The devices 300A, 300B, 300C, 300D each comprise a device layer 305A, 305B, 305C, 305D and a metallization layer 310A, 310B, 310C, 310D. The metallization layers 310A, 310B, 310C, 310D may include multiple layers, such as the metallization layers M0-Mx shown in FIG. 1. In some embodiments, the metallization layers 310A, 310B, 310C, 310D each comprise the passivation layers 220, 250, the polyimide layer 235, and the conductive contact pads 225, 230, 255, 260. At least some of the devices 300A, 300B, 300C, 300D comprise first regions 110A, 110B including the TSV structure 210, a second region 115 including the TSV structure 215, and third regions 117A, 117B, 117C including the TSV structure 217. In some embodiments, the TSV structures 210, 215, 217 do not extend through the lowermost device 300A, but rather, the TSV structures 210, 215, 217 conductively contact conductive contact pads on the uppermost surface of the device 300A.

In some embodiments, the first regions 110A, 110B comprise core regions, the second region 115 comprises an I/O region, and the third regions 117A, 117B, 117C comprises power distribution regions. In some embodiments, the first regions 110A, 110B and the second region 115 operate using different supply voltages. In some embodiments, a first supply voltage of the first regions 110A, 110B is less than a second supply voltage of the second region 115. In some embodiments, the third regions 117A, 117B, 117C are power planes for providing power for the devices 300A, 300B, 300C, 300D at the second supply voltage, which is stepped down to the first supply voltage to supply power to the first regions 110A, 110B. In some embodiments, the TSV structure 210 has a first cross-sectional area, the TSV structure 215 has a second cross-sectional area greater than the first cross-sectional area, and the TSV structure 217 has a third cross-sectional area greater than the second cross-sectional area. The first cross-sectional area, the second cross-sectional area, and the third cross-sectional area are compared in the same plane, since the TSV structures 210, 215, 217 may taper along their lengths. The increased cross-sectional areas of the TSV structures 215, 217 result in reduced resistive power losses. In some embodiments, the first regions 110A, 110B have an increased density of TSV structures 210 compared to the density of the TSV structures 215, 217 in the regions 115 117A, 117B, 117C, tending to increase performance in the first regions 110A, 110B.

Figure 7A:
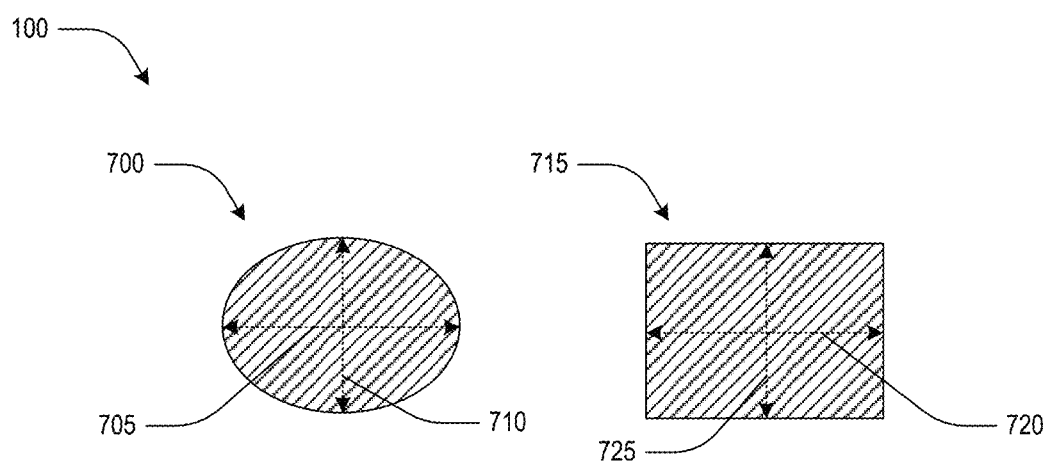

Referring to FIG. 7A, a top view of portions of the semiconductor arrangement 100 is provided, according to some embodiments. In some embodiments, the semiconductor arrangement 100 comprises a TSV structure 700 having an elliptical cross-sectional shape defined by a first axis 705 and a second axis 710. In some embodiments, the first axis 705 is longer than the second axis 710. In some embodiments, the first axis 705 and the second axis 710 have the same length, defining an ellipse that is also a circle. In some embodiments, the semiconductor arrangement 100 comprises a TSV structure 715 having a rectangular cross-sectional shape defined by a first dimension 720 and a second dimension 725. In some embodiments, the first dimension 720 is longer than the second dimension 725. In some embodiments, the first dimension 720 and the second dimension 725 have the same length, defining a rectangle that is also a square. In some embodiments, the TSV structures 210, 215, 217 have the same cross-sectional shapes, such as the elliptical cross-sectional shape of the TSV structure 700 or the rectangular cross-sectional shape of the TSV structure 715, albeit with different axis lengths or dimensions to provide differing cross-sectional areas.

In some embodiments, the TSV structures 210, 215, 217 have different cross-sectional shapes. For example, some of the TSV structures 210, 215, 217 may have elliptical cross-sectional shapes, such as the elliptical cross-sectional shape of the TSV structure 700, and others of the TSV structures 210, 215, 217 may have rectangular cross-sectional shapes, such as the rectangular cross-sectional shape of the TSV structure 715, albeit with different axis lengths or dimensions to provide differing cross-sectional areas.

Providing the TSV structures 210, 215, 217 with differing cross-sectional areas allows for design flexibility and improves performance. Resistance is reduced in regions with larger TSV structures 215, 217, such as input/output regions or power supply regions, thereby decreasing power consumption. Density is increased in regions with smaller TSV structures 210, such as core regions, thereby increasing performance.

Figure 8:
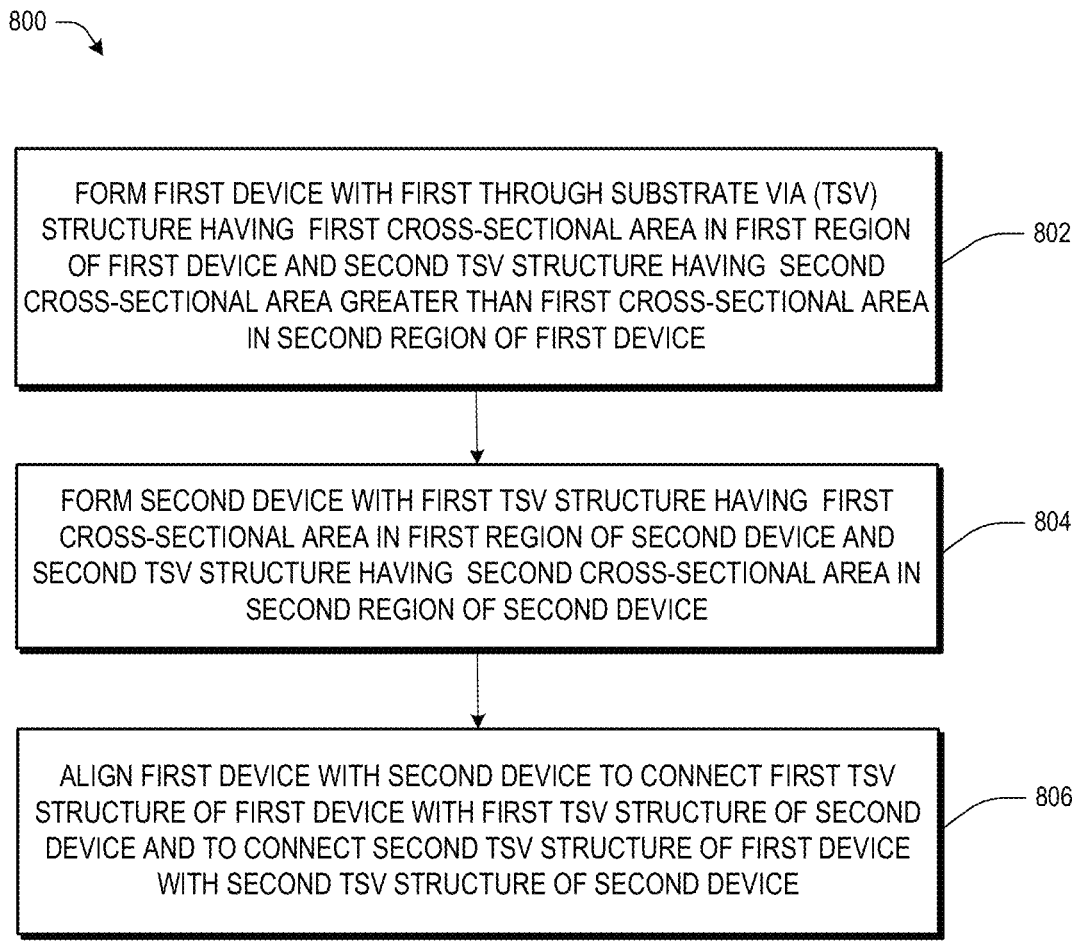
FIG. 8 is a flow chart illustrating a method of handling a semiconductor substrate, in accordance with some embodiments.

FIG. 8 is a flow diagram illustrating a method 800 for forming a semiconductor arrangement, in accordance with some embodiments. At 802, a first device, such as device 300B, with a first TSV structure having a first cross-sectional area, such as the TSV structure 210, is formed in a first region, such as the first region 110, of the first device and a second TSV structure having a second cross-sectional area, such as at least one of the TSV structures 215, 217, greater than the first cross-sectional area is formed in a second region, such as the second region 115 or the third region 117, of the first device. At 804, a second device, such as device 300C, with a first TSV structure having the first cross-sectional area, such as the TSV structure 210, is formed in a first region, such as the first region 110, of the second device and a second TSV structure having the second cross-sectional area, such as at least one of the TSV structures 215, 217, is formed in a second region, such as the second region 115 or the third region 117, of the second device. At 806, the first device is aligned with the second device to connect the first TSV structure of the first device with the first TSV structure of the second device and to connect the second TSV structure of the first device with the second TSV structure of the second device.

Figure 9:
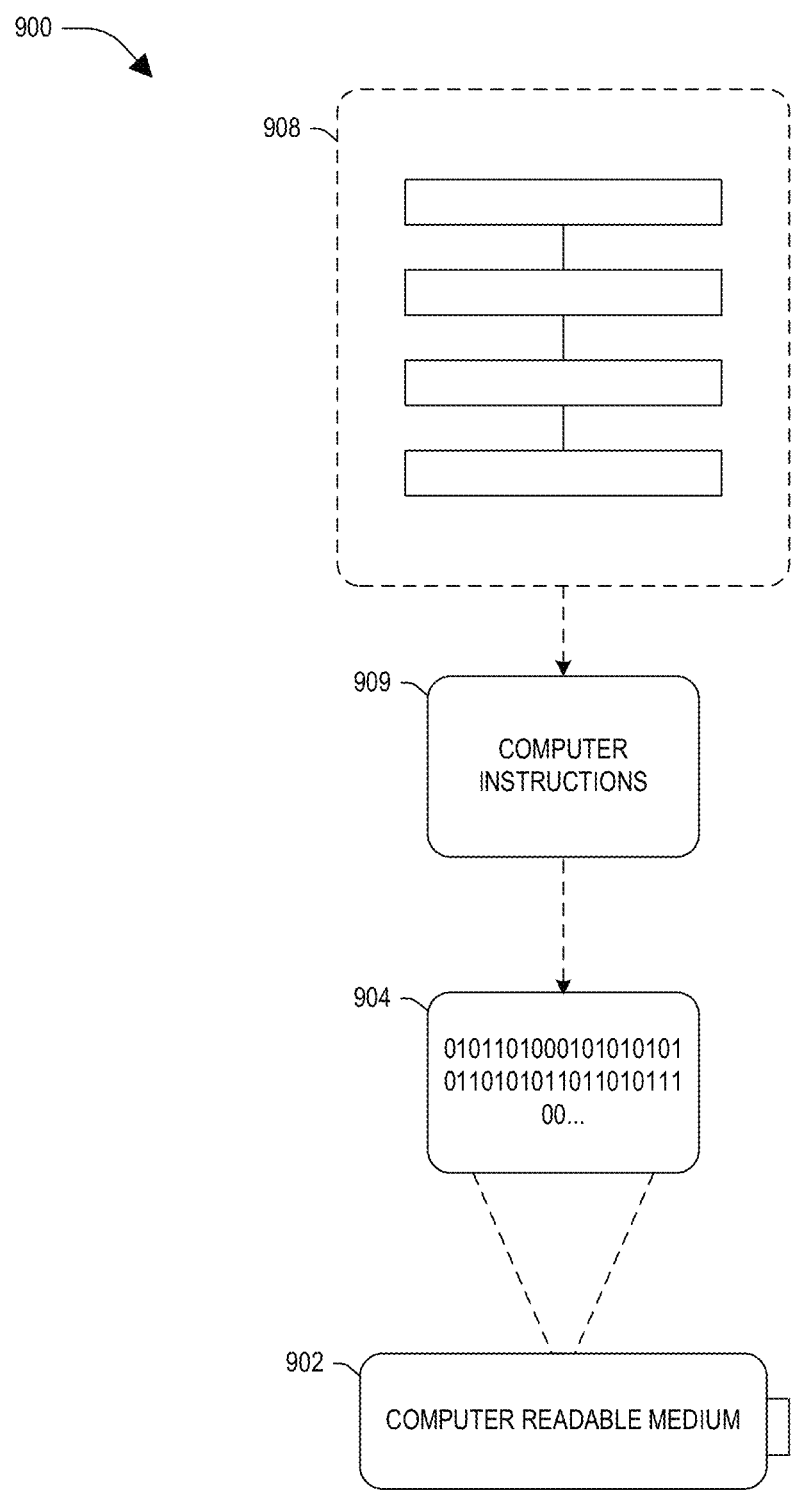
FIG. 9 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 9, wherein the embodiment 900 comprises a computer-readable medium 902 (e.g., a CD-R, DVD-R, flash drive, a platter of a hard disk drive, etc.), on which is encoded computer-readable data 904. This computer-readable data 904 in turn comprises a set of processor-executable computer instructions 906 configured to operate according to one or more of the principles set forth herein. In some embodiments 900, the processor-executable computer instructions 906 are configured to perform a method 908, such as at least some of the aforementioned described method. In some embodiments, the processor-executable computer instructions 906 are configured to implement a system. Many such computer-readable media may be devised by those of ordinary skill in the art that are configured to operate in accordance with the techniques presented herein.

Figure 10:
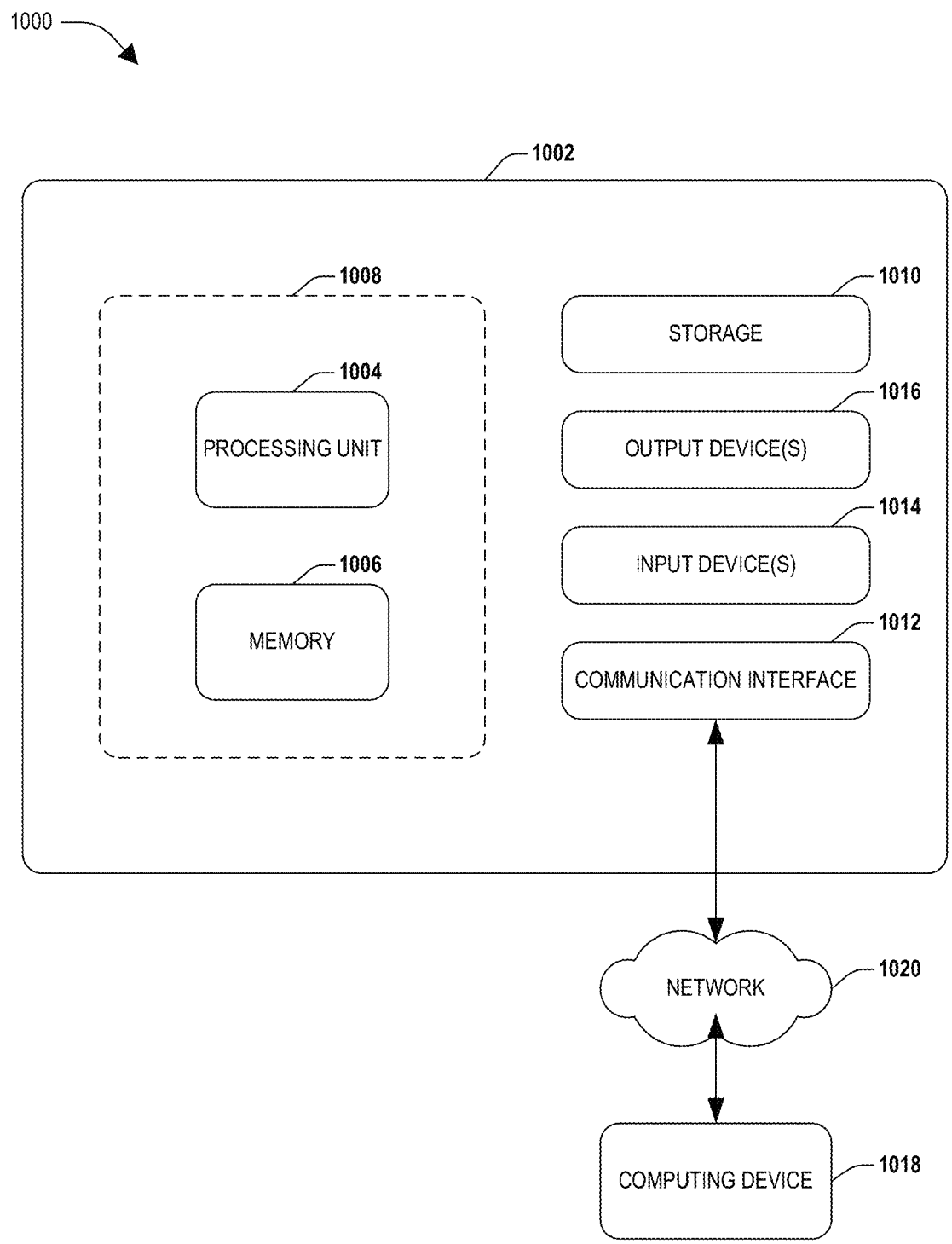
FIG. 10 illustrates an example computing environment wherein one or more of the provisions set forth herein may be implemented, in accordance with some embodiments.

FIG. 10 and the following discussion provide a brief, general description of a suitable computing environment to implement embodiments of one or more of the provisions set forth herein. The operating environment of FIG. 10 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 10 depicts an example of a system 1000 comprising a computing device 1002 to implement some embodiments provided herein. In some configurations, computing device 1002 includes at least one processing unit 1004 and memory 1006. Depending on the exact configuration and type of computing device, the memory 1006 may be volatile (such as random access memory (RAM), for example), non-volatile (such as read-only memory (ROM), flash memory, etc., for example) or some combination of the two. This configuration is illustrated in FIG. 10 by dashed line 1008.

In some embodiments, the computing device 1002 may include additional features and/or functionality. For the example, the computing device 1002 may also include additional storage (e.g., removable and/or non-removable) including, but not limited to, magnetic storage, optical storage, and the like. Such additional storage is illustrated in FIG. 10 by storage 1010. In some embodiments, computer readable instructions to implement one or more embodiments provided herein may be in the storage 1010. The storage 1010 may also store other computer readable instructions to implement an operating system, an application program, and the like. Computer readable instructions may be loaded in the memory 1006 for execution by processing unit 1004, for example.

The term "computer readable media" as used herein includes computer storage media. Computer storage media includes volatile and nonvolatile, removable and non-removable media implemented in any method or technology for storage of information such as computer readable instructions or other data. The memory 1006 and storage 1010 are examples of computer storage media. Computer storage media includes, but is not limited to, RAM, ROM, electrically erasable programmable read-only memory (EEPROM), flash memory, or other memory technology, CD-ROM, Digital Versatile Disks (DVDs), or other optical storage, magnetic cassettes, magnetic tape, magnetic disk storage, or other magnetic storage devices, or any other medium which can be used to store the desired information and which can be accessed by the computing device 1002. Any such computer storage media may be part of the computing device 1002.

In some embodiments, the computing device 1002 comprises a communication interface 1012, or a multiple communication interfaces, that allow the computing device 1002 to communicate with other devices. The communication interface 1012 may include, but is not limited to, a modem, a Network Interface Card (NIC), an integrated network interface, a radio frequency transmitter/receiver, an infrared port, a Universal Serial Bus (USB) connection, or other interface for connecting the computing device 1002 to other computing devices. The communication interface 1012 may implement a wired connection or a wireless connection. The communication interface 1012 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 1002 may include input device(s) 1014 such as keyboard, mouse, pen, voice input device, touch input device, infrared cameras, video input devices, and/or any other suitable input device. An output device(s) 1016, such as one or more displays, speakers, printers, and/or any other suitable output device, may also be included in the computing device 1002. The input device(s) 1014 and the output device(s) 1016 may be connected to the computing device 1002 via a wired connection, wireless connection, or any combination thereof. In some embodiments, an input device or an output device from another computing device may be used as the input device(s) 1014 or the output device(s) 1016 for the computing device 1002.

Components of the computing device 1002 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 1002 may be interconnected by a network. For example, the memory 1006 may be comprised of multiple physical memory units located in different physical locations interconnected by a network.

Those skilled in the art will realize that storage devices utilized to store computer readable instructions may be distributed across a network. For example, a computing device 1018 accessible via a network 1020 may store computer readable instructions to implement one or more embodiments provided herein. The computing device 1002 may access the computing device 1018 and download a part or all of the computer readable instructions for execution. Alternatively, the computing device 1002 may download pieces of the computer readable instructions, as needed, or some instructions may be executed at the computing device 1002 and some instructions may be executed at the computing device 1018.

According to some embodiments, a method of forming a semiconductor arrangement includes forming a first device with a first through substrate via (TSV) structure in a first region of the first device and a second TSV structure in a second region of the first device. A second device is formed with a first TSV structure in a first region of the second device and a second TSV structure in a second region of the second device. The first device is aligned with the second device to connect the first TSV structure of the first device with the first TSV structure of the second device and to connect the second TSV structure of the first device with the second TSV structure of the second device. The first TSV structure of the first device and the first TSV structure of the second device have a first cross-sectional area. The second TSV structure of the first device and the second TSV structure of the second device have a second cross-sectional area greater than the first cross-sectional area.

According to some embodiments, a semiconductor arrangement includes a device having a first surface and a second surface opposite the first surface. A first through substrate via (TSV) structure extends between the first surface and the second surface in a first region of the device. A second TSV structure extends between the first surface and the second surface in a second region of the device. The first TSV structure has a first cross-sectional area. The second TSV structure has a second cross-sectional area greater than the first cross-sectional area.

According to some embodiments, a semiconductor arrangement includes a first device with a first through substrate via (TSV) structure in a first region of the first device, a second TSV structure in a second region of the first device, and a third TSV structure in a third region of the first device. A second device includes a first TSV structure in a first region of the second device conductively contacting the first TSV structure of the first device, a second TSV structure in a second region of the second device conductively contacting the second TSV structure of the first device, and a third TSV structure in a third region of the second device conductively contacting the third TSV structure of the first device. The first TSV structure of the first device and the first TSV structure of the second device have a first cross-sectional area. One of the second TSV structure of the first device and the second TSV structure of the second device or the third TSV structure of the first device and the third TSV structure of the second device has a second cross-sectional area greater than the first cross-sectional area.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
  forming a first device with a first through substrate via (TSV) structure in a first region of the first device, a second TSV structure in a second region of the first device, and a third TSV structure in a third region of the first device;

forming a second device with a first TSV structure in a first region of the second device, a second TSV structure in a second region of the second device, and a third TSV structure in a third region of the second device; and aligning the first device with the second device to connect the first TSV structure of the first device with the first TSV structure of the second device, to connect the second TSV structure of the first device with the second TSV structure of the second device, and to connect the third TSV structure of the first device with the third TSV structure of the second device, wherein:

the first TSV structure of the first device and the first TSV structure of the second device have a first cross-sectional area, the second TSV structure of the first device and the second TSV structure of the second device have a second cross-sectional area greater than the first cross-sectional area, and the third TSV structure of the first device and the third TSV structure of the second device have a third cross-sectional area greater than the second cross-sectional area.

2. The method of claim 1, wherein the first region of the first device and the first region of the second device comprise core regions.

3. The method of claim 1, wherein the second region of the first device and the second region of the second device comprise input/output regions.

4. The method of claim 1, wherein the first TSV structure of the first device has a rectangular cross-sectional shape.

5. The method of claim 1, wherein the first TSV structure of the first device has an elliptical cross-sectional shape.

6. The method of claim 1, wherein:
the first TSV structure of the first device has a first cross-sectional shape, and
the second TSV structure of the first device has a second cross-sectional shape different than the first cross-sectional shape.

7. The method of claim 1, wherein:
the first region of the first device comprises a first active device configured to operate with a first supply voltage, and
the second region of the first device comprises a second active device configured to operate with a second supply voltage greater than the first supply voltage.

8. A semiconductor arrangement, comprising:
a device having a first surface and a second surface opposite the first surface;
a first through substrate via (TSV) structure extending between the first surface and the second surface in a first region of the device;
a second TSV structure extending between the first surface and the second surface in a second region of the device; and
a third TSV structure extending between the first surface and the second surface in a third region of the device, wherein:
the first TSV structure has a first cross-sectional area,
the second TSV structure has a second cross-sectional area greater than the first cross-sectional area, and
the third TSV structure has a third cross-sectional area greater than the second cross-sectional area.

9. The semiconductor arrangement of claim 8, wherein the first region comprises a core region.

10. The semiconductor arrangement of claim 8, wherein the second region comprises an input/output region.

11. The semiconductor arrangement of claim 8, wherein the third region comprise a power distribution region.

12. The semiconductor arrangement of claim 8, wherein the first TSV structure has a rectangular cross-sectional shape.

13. The semiconductor arrangement of claim 8, wherein the first TSV structure has an elliptical cross-sectional shape.

14. The semiconductor arrangement of claim 8, wherein:
the first TSV structure has a first cross-sectional shape, and
the second TSV structure has the first cross-sectional shape.

15. The semiconductor arrangement of claim 8, wherein:
the first region comprises a first transistor configured to operate with a first supply voltage, and
the second region comprises a second transistor configured to operate with a second supply voltage greater than the first supply voltage.

16. The semiconductor arrangement of claim 8, wherein:
the first region comprises a core region,
the second region comprises an input/output region, and
the third region comprise a power distribution region.

17. The semiconductor arrangement of claim 8, comprising:
a first passivation layer above the device and the first TSV structure; and
a second passivation layer below the device and the first TSV structure.

18. A semiconductor arrangement, comprising:
a first device with a first through substrate via (TSV) structure in a first region of the first device, a second TSV structure in a second region of the first device, and a third TSV structure in a third region of the first device; and
a second device with a first TSV structure in a first region of the second device conductively contacting the first TSV structure of the first device, a second TSV structure in a second region of the second device conductively contacting the second TSV structure of the first device, and a third TSV structure in a third region of the second device conductively contacting the third TSV structure of the first device, wherein:
the first TSV structure of the first device and the first TSV structure of the second device have a first cross-sectional area, and
one of the second TSV structure of the first device and the second TSV structure of the second device or the third TSV structure of the first device and the third TSV structure of the second device has a second cross-sectional area greater than the first cross-sectional area.

19. The semiconductor arrangement of claim 18, wherein:
the second TSV structure of the first device and the second TSV structure of the second device have the first cross-sectional area, and
the third TSV structure of the first device and the third TSV structure of the second device have the second cross-sectional area.

20. The semiconductor arrangement of claim 18, wherein:
the second TSV structure of the first device and the second TSV structure of the second device have the second cross-sectional area, and the third TSV structure of the first device and the third TSV structure of the second device have a third cross-sectional different than the first cross-sectional area and the second cross-sectional area.

* * * * *